(12) United States Patent
Stoll et al.

(10) Patent No.: US 9,831,390 B2
(45) Date of Patent: Nov. 28, 2017

(54) METHOD FOR FIXING A MATRIX-FREE ELECTROPHORETICALLY DEPOSITED LAYER ON A SEMICONDUCTOR CHIP FOR THE PRODUCTION OF A RADIATION-EMITTING SEMICONDUCTOR COMPONENT, AND RADIATION-EMITTING SEMICONDUCTOR COMPONENT

(71) Applicant: OSRAM Opto Semiconductors GmbH, Regensburg (DE)

(72) Inventors: Ion Stoll, Tegernheim (DE); Sebastian Taeger, Bad Abbach (DE); Hans-Christoph Gallmeier, Regensburg (DE); Gudrun Lindberg, Bad Abbach (DE); Stefan Hartauer, Wolfsegg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 2 days.

(21) Appl. No.: 14/428,896

(22) PCT Filed: Sep. 16, 2013

(86) PCT No.: PCT/EP2013/069151
§ 371 (c)(1),
(2) Date: Mar. 17, 2015

(87) PCT Pub. No.: WO2014/041165
PCT Pub. Date: Mar. 20, 2014

(65) Prior Publication Data
US 2015/0255683 A1    Sep. 10, 2015

(30) Foreign Application Priority Data

Sep. 17, 2012    (DE) .................... 10 2012 108 704

(51) Int. Cl.
*H01L 29/22* (2006.01)
*H01L 33/44* (2010.01)
(Continued)

(52) U.S. Cl.
CPC .............. *H01L 33/44* (2013.01); *H01L 33/46* (2013.01); *H01L 33/502* (2013.01);
(Continued)

(58) Field of Classification Search
CPC ...................................................... H01L 33/46
See application file for complete search history.

(56) References Cited

U.S. PATENT DOCUMENTS 6,576,488 B2    6/2003    Collins, III et al.
7,982,233 B2    7/2011    Berben et al.
(Continued)

FOREIGN PATENT DOCUMENTS

DE    102006024165 A1    11/2007
DE    102007042642 A1    3/2009
(Continued)

*Primary Examiner* — Matthew E Warren
(74) *Attorney, Agent, or Firm* — Slater Matsil, LLP

(57) ABSTRACT

A method can be used for fixing a matrix-free electrophoretically deposited layer on a semiconductor chip. A semiconductor wafer has a carrier substrate and at least one semiconductor chip. The at least one semiconductor chip has an active zone for generating electromagnetic radiation. At least one contact area is formed on a surface of the at least one semiconductor chip facing away from the carrier substrate. A material is electrophoretically deposited on the surface of the at least one semiconductor chip facing away from the carrier substrate in order to form the electrophoretically deposited layer. Deposition of the material on the at least one contact area is prevented. An inorganic matrix material is applied to at least one section of a surface of the semiconductor wafer facing away from the carrier substrate (Continued)

in order to fix the material on the at least one semiconductor chip.

18 Claims, 4 Drawing Sheets

(51) Int. Cl.
  *H01L 33/46* (2010.01)
  *H01L 33/50* (2010.01)
  *H01L 33/62* (2010.01)

(52) U.S. Cl.
  CPC ............ *H01L 33/505* (2013.01); *H01L 33/62* (2013.01); *H01L 2224/48091* (2013.01); *H01L 2224/8592* (2013.01); *H01L 2933/0025* (2013.01); *H01L 2933/0033* (2013.01); *H01L 2933/0041* (2013.01); *H01L 2933/0058* (2013.01); *H01L 2933/0066* (2013.01); *H01L 2933/0091* (2013.01)

(56) References Cited

U.S. PATENT DOCUMENTS

| 8,946,742 B2* | 2/2015 | Yu .................... H01L 21/76877 257/98 |
| 8,962,361 B2 | 2/2015 | Petersen et al. |
| 2008/0179611 A1 | 7/2008 | Chitnis et al. |
| 2009/0014736 A1 | 1/2009 | Ibbetson et al. |
| 2009/0179611 A1 | 7/2009 | Sander et al. |
| 2013/0313604 A1 | 11/2013 | Engl et al. |

FOREIGN PATENT DOCUMENTS

| DE | 102010053362 A1 | 6/2012 |
| DE | 102011016935 A1 | 10/2012 |
| DE | 102012105691 A1 | 1/2014 |
| WO | 9850945 A2 | 11/1998 |
| WO | 2011033516 A1 | 3/2011 |

\* cited by examiner

METHOD FOR FIXING A MATRIX-FREE ELECTROPHORETICALLY DEPOSITED LAYER ON A SEMICONDUCTOR CHIP FOR THE PRODUCTION OF A RADIATION-EMITTING SEMICONDUCTOR COMPONENT, AND RADIATION-EMITTING SEMICONDUCTOR COMPONENT

This patent application is a national phase filing under section 371 of PCT/EP2013/069151, filed Sep. 16, 2013, which claims the priority of German patent application 10 2012 108 704.0, filed Sep. 17, 2012, each of which is incorporated herein by reference in its entirety.

TECHNICAL FIELD

A method for fixing a matrix-free electrophoretically deposited layer on a semiconductor chip is specified. Furthermore, a radiation-emitting semiconductor component is specified.

SUMMARY

Embodiments of the present application specify an effective method for fixing a matrix-free electrophoretically deposited layer on a semiconductor chip. Further embodiments of the present application specify a radiation-emitting semiconductor component which is particularly stable and efficient.

In accordance with one aspect, a method for mechanically stabilizing or fixing an electrophoretically deposited layer, electrophoretic layer for short, is described. In this case, the electrophoretic layer is mechanically stabilized or fixed on at least one semiconductor chip. Furthermore, a radiation-emitting semiconductor component is produced with the aid of the method described below.

The method comprises the following steps. In a first step, a semiconductor wafer is provided. The semiconductor wafer has at least one semiconductor chip. Preferably, the semiconductor wafer has a multiplicity of semiconductor chips, for example, at least five or at least ten semiconductor chips. The semiconductor wafer can have, for example, up to 200,000 semiconductor chips.

The respective semiconductor chip is preferably a semiconductor chip based on a III-V semiconductor material. Preferably, the semiconductor chip is a light-emitting diode (LED) chip. The semiconductor chip is suitable for emitting electromagnetic radiation, in particular light. The semiconductor chip preferably emits colored light. However, the semiconductor chip can also emit ultraviolet (UV) radiation. The semiconductor chip has an active zone for generating the electromagnetic radiation.

All the semiconductor chips can be structurally identical. Alternatively, it is possible to provide semiconductor chips of different types, in particular based on different semiconductor materials, which semiconductor chips are preferably designed for emission in different spectral ranges. The semiconductor wafer is then a so-called artificial wafer, in which presorted semiconductor chips are applied to a carrier substrate.

The semiconductor wafer furthermore has a carrier substrate. The semiconductor chip or the multiplicity of semiconductor chips is arranged on the carrier substrate. The carrier substrate serves for mechanically stabilizing the semiconductor chips. The carrier substrate can be a growth substrate for the layers of the semiconductor chips. The carrier substrate then comprises silicon or sapphire, for example. Particularly in the case of an artificial wafer, the carrier substrate can also comprise materials such as glass, plastic or metal.

The carrier substrate preferably has separating trenches or sawing trenches. The separating trenches are arranged on a surface of the carrier substrate facing the semiconductor chips. The separating trenches constitute depressions or furrows in the surface of the carrier substrate. The individual semiconductor chips are spatially separated from one another by the separating trenches. The separating trenches serve to singulate the semiconductor wafer in a later method step for producing individual radiation-emitting components.

The respective semiconductor chip has at least one contact location, for example, a so-called bonding pad. The contact location serves for electrically contacting the semiconductor chip. The contact location is formed at a surface of the semiconductor chip facing away from the carrier substrate, in particular in a partial region of said surface. Via the contact location, the semiconductor chip can be contacted, for example, by means of a contact wire, for example, by means of wire bonding.

In a next step, a material is electrophoretically deposited on the surface of the respective semiconductor chip facing away from the carrier substrate, in order to form the electrophoretic layer. The material can, for example, comprise particles of a luminophore or particles of a reflective material or be formed from particles of a luminophore or particles of a reflective material. Titanium oxide or aluminum oxide is preferably used as reflective material.

The material preferably serves to at least partly convert the primary radiation emitted by the semiconductor chip into an electromagnetic secondary radiation. By way of example, the material comprises phosphor particles. The material is preferably a wavelength conversion material. Accordingly, the electrophoretic layer is preferably a wavelength conversion or luminophore layer.

The electrophoretic layer is matrix-free. That is to say that the particles of the electrophoretic layer are not embedded in a matrix material, such as, for example, plastic, glass or ceramic. Rather, the electrophoretic layer is formed solely by the particles. In a manner governed by production, however, the electrophoretic layer can also comprise deposited salts from a suspension, as is described further below.

The process of electrophoretically depositing the material is described, for example, in the German patent application having the file reference DE 10 2012 105 691.9, the disclosure content of which is hereby incorporated by reference.

In particular, the electrophoretic deposition is effected in the following steps. An electrically conductive layer is applied at least partly to the carrier substrate, for example, by thermal vapor deposition or sputtering onto the carrier substrate. The electrically conductive layer can comprise one of the following materials or consists of one of the following materials: lithium, sodium, potassium, rubidium, cesium, beryllium, calcium, magnesium, strontium, barium, scandium, titanium, aluminum, silicon, gallium, tin, zirconium, zinc oxide, zinc sulfide, zinc selenide, zinc telluride, tin oxide.

The electrically conductive layer is suitable for at least partly forming a salt with a protic reaction partner. The protic reaction partner can be contained in a liquid or a gas or can be present as a liquid or as a gas. By way of example, the protic reaction partner is water, an alcohol, a carboxylic acid, a mineral acid, an amine, an amide or a mixture of at least two such materials.

In a further step, the electrophoretic layer is deposited onto the electrically conductive layer in an electrophoresis bath. The electrophoresis bath can comprise one of the following substances as organic solvent: alcohol, ketone, aromatic compound, aldehyde. These materials generally advantageously do not react or react only very slightly with a metal, a metal alloy, a semimetal or a semiconductor material, that is to say the preferred material for the electrically conductive layer.

As a result of an electrical voltage being applied to the electrophoresis bath, the material to be deposited, that is to say preferably the wavelength conversion material, migrates in the electrophoresis bath to the coated carrier substrate and deposits on the electrically conductive layer, such that the electrophoretically deposited layer arises. After the electrophoretic deposition, the coated carrier substrate is removed again from the electrophoresis bath.

After the electrophoretic layer has been electrophoretically deposited, at least the electrically conductive layer is then introduced into the protic reaction partner, such that the electrically conductive layer at least partly forms a salt comprising a constituent of the protic reaction partner.

In a next step, the salt formed is at least partly washed out, for example, dissolved out wet-chemically, by means of a solvent. A matrix-free electrophoretically deposited layer, in particular a matrix-free wavelength conversion layer, is thus obtained on the surface of the semiconductor wafer facing away from the carrier substrate.

Preferably, the electrically conductive layer is applied to the carrier substrate in a structured fashion. The regions of the carrier substrate which are not intended to be provided with the electrically conductive layer can be protected during the deposition of the electrically conductive layer, for example, by means of shadow masks or a photoresist layer. However, the electrically conductive layer can also be structured by means of scribing or by a laser.

By way of example, the contact location and further regions on which electrophoretic deposition is not desired are covered with resist, for example, by means of photolithography. After the electrically conductive layer has been applied, the resist is dissolved out again below the electrically conductive layer, such that the electrically conductive layer is preferably present only on the surface of the semiconductor chip facing away from the carrier substrate and, in particular, the contact location has no electrically conductive layer. Alternatively, the electrically conductive layer can be removed together with the resist and thereby structured (so-called lift-off). Furthermore, the contact location can be kept potential-free during the electrophoretic deposition. In other words, the contact location is preferably not electrically contacted during the electrophoretic deposition, with the result that no electrophoretic layer is deposited on the contact location.

Using an electrically insulating carrier substrate, in this way the electrophoretic layer is deposited in a targeted manner only on partial regions of the carrier substrate, namely on those partial regions which are provided with the electrically conductive layer.

Deposition of the electrophoretic layer on the separating trenches can also be prevented with the aid of resist or a mask. As an alternative thereto, it is possible in this way to apply an electrically conductive layer to the separating trenches which is thinner than the electrically conductive layer on the surface of the semiconductor chip facing away from the carrier substrate, in order to produce an electrical contact between metallizations of the active zones of a plurality of semiconductor chips.

In summary, the use of a mask or resist prevents deposition of the material or of the electrophoretic layer on the at least one contact region of the semiconductor chip. In other words, the electrophoretic deposition is effected in such a way that the contact region of the semiconductor chip remains free from the material or the electrophoretic layer. The separating trenches also accordingly remain at least predominantly free of the material.

In a further step, a matrix material is applied to at least one partial region of the surface of the semiconductor wafer facing away from the carrier substrate. The matrix material is applied at least on the surface of the semiconductor chip facing away from the carrier substrate. In other words, the matrix material is applied at least on the electrophoretically deposited layer and on the contact location. The matrix material preferably completely surrounds the material of the electrophoretic layer, in particular in the form of a layer composed of matrix material.

Preferably, the matrix material is applied on the complete surface of the semiconductor wafer facing away from the carrier substrate. In other words, the surface of the semiconductor wafer facing away from the carrier substrate is preferably completely covered with the matrix material or the layer composed of matrix material. In this case, the matrix material can also penetrate into interspaces between the particles of the electrophoretically deposited layer.

The matrix material is inorganic. By virtue of the use of an inorganic material, by way of example, required subsequent processes in production lines prohibiting silicone-based materials can still be carried out.

The matrix material serves for fixing or stabilizing the electrophoretically deposited material or the electrophoretic layer on the semiconductor chip. The particles of the electrophoretic layer are effectively encapsulated and thus stabilized or fixed by the matrix material. The layer composed of matrix material is formed around the electrophoretic layer. A high mechanical stability of the electrophoretic layer is achieved as a result.

The electrophoretic layer and thus also the semiconductor chip are effectively protected against external influences by the matrix material. Damage or even destruction of the electrophoretic layer by further production steps, such as, for example, singulation of the semiconductor wafer, adhesive-bonding or cleaning steps for the individual semiconductor components produced in the further method, can also be prevented by the matrix material.

In accordance with at least one embodiment, applying the matrix material is effected by initiating at least one chemical reaction. The at least one chemical reaction is initiated at least in the partial region of the surface of the semiconductor wafer facing away from the carrier substrate. Preferably, the chemical reaction is effected on the complete surface of the semiconductor wafer facing away from the carrier substrate.

As a result of the chemical reaction, the inorganic matrix material is deposited at least on a part of the surface of the semiconductor wafer facing away from the carrier substrate, and the electrophoretic layer is thus mechanically stabilized and fixed on the semiconductor chip.

In accordance with at least one embodiment, during the chemical reaction a metal oxide layer is formed as matrix material at least on the partial region of the surface of the semiconductor wafer facing away from the carrier substrate. The metal oxide layer can comprise, for example, silicon dioxide ($SiO_2$), aluminum dioxide ($Al_2O_3$), titanium dioxide ($TiO_2$), zirconium dioxide ($ZrO_2$) or hafnium dioxide ($HfO_2$). A metal oxide layer is particularly distinguished by its strength. An effective stabilization of the electrophoretic layer can be achieved as a result.

In accordance with at least one embodiment, the metal oxide layer can be applied in a plasma-enhanced vapor deposition process (plasma-enhanced chemical vapor deposition, PECVD) to the surface of the semiconductor wafer facing away from the carrier substrate or to parts of the surface.

In this method, the surface of the semiconductor wafer facing away from the carrier substrate (that is to say the surface to be coated) is introduced into a volume. In said volume, at least one starting material, preferably a gaseous starting material, is furthermore made available, from which the metal oxide layer is deposited as a result of the above-described chemical reaction at the surface.

In the present case, a tetraethyl orthosilicate (TEOS, $Si(OC_2H_5)_4$) is preferably made available as starting material in order to deposit the metal oxide layer on at least the partial region of the surface of the semiconductor wafer facing away from the carrier substrate. However, other starting materials such as, for example, silicon tetrachloride ($SiCl_4$), monosilane ($SiH_4$) and/or nitrogen monoxide (NO) are also conceivable.

In general, in the volume there is situated at least one second gaseous starting material, for example, oxygen ($O_2$), nitrogen ($N_2$), water ($H_2O$) and/or hydrogen ($H_2$), with which the first starting material (preferably TEOS) reacts chemically to form the solid metal oxide layer at the surface. However, it is also possible to use more than two starting materials.

In general, the chemical reaction takes place at a specific reaction temperature. Particularly preferably, the surface to be coated is at the reaction temperature at which the chemical reaction for forming the solid metal oxide layer takes place. In the PECVD method, for this purpose generally a plasma is ignited in the volume during the chemical deposition.

On account of a high surface mobility of the TEOS molecules which are preferably used as first starting material, the particles of the electrophoretic layer are optimally encapsulated by the matrix material, in particular the metal oxide layer. A mechanical stabilization of the electrophoretic layer is thus achieved in a simple and effective manner.

During the deposition of the metal oxide layer, a shadow mask can be used, such that the metal oxide layer is deposited only on the electrophoretic layer itself. In other words, in this case, the metal oxide layer is not deposited on the contact locations and the carrier substrate. As an alternative thereto, the metal oxide layer can also be deposited on the complete surface of the semiconductor wafer facing away from the carrier substrate, that is to say on the semiconductor chip, the contact location, the separating trenches and the remaining parts of the surface of the carrier substrate. In this case, the use of a mask is superfluous.

The layer composed of matrix material deposited by the PECVD method preferably has a thickness of between 50 nm and 500 nm, for example, 200 nm.

If the thickness of the layer is 200 nm or less, then a subsequent step can involve bonding the at least one semiconductor chip through the metal oxide layer onto the contact region. In other words, in the case where the metal oxide layer has only a small thickness (e.g., 50 nm to 200 nm), a bonding wire can be connected to the contact region through the metal oxide layer.

In the case where the metal oxide layer has a larger thickness (e.g., 250 nm, 300 nm, or more), a further step, which can be performed before or after singulation of the semiconductor wafer, can involve removing the matrix material, in particular the metal oxide layer, in the region of the at least one contact region. The matrix material deposited on the rest of the surface of the semiconductor chip is not removed by the removing process, and so the electrophoretic layer applied on the surface is also still enveloped by the matrix material.

The removing process takes place, for example, by means of reactive sputtering or by means of a plasma process, for example, plasma etching. After the removal of the metal oxide layer in the region of the contact region, the semiconductor chip can then be bonded. If removal is carried out before singulation, then in this step it is also possible to remove the matrix material in the region of the separating trenches of the carrier substrate, in order to facilitate later singulation of the semiconductor wafer.

In accordance with at least one embodiment, the matrix material, in particular the metal oxide layer, can also be applied in a cyclic vapor deposition process, however. In particular, the matrix material can be deposited in an atomic layer deposition (ALD) process on at least the partial region of the surface of the semiconductor wafer facing away from the carrier substrate, preferably on the complete surface.

In this method, too, the surface of the semiconductor wafer facing away from the carrier substrate (that is to say the surface to be coated) is introduced into a volume. At least one first gaseous starting material, e.g., trimethylaluminum (TMAT, $C_3H_9Al$) or tantalum pentachloride ($TaCl_5$), is fed into the volume, such that the first gaseous starting material adsorbs on the surface to be coated.

After the surface of the semiconductor wafer facing away from the carrier substrate has been preferably completely or almost completely covered with the first starting material, that part of the first starting material which is still present in gaseous form or in a manner not adsorbed on the surface is generally removed again from the volume. A second starting material, for example, $O_2$, is subsequently fed in. The second starting material is provided for reacting chemically with the first starting compound adsorbed at the surface to form the solid metal oxide.

Since the particles of the electrophoretic layer are particularly optimally encapsulated in this method, a thin layer of the matrix material already suffices for fixing or stabilizing the electrophoretic layer.

The layer deposited by the ALD method preferably has a thickness of between 50 nm and 200 nm. This layer is not planar on account of its only small thickness, but rather assumes the contours of the particles of the electrophoretic layer arranged underneath.

By means of the ALD method, matrix material is preferably deposited not just on the surface of the electrophoretic layer. Rather, by means of the ALD method, matrix material is also introduced below and between the particles of the electrophoretic layer. The electrophoretic layer is fixed or stabilized particularly efficiently as a result. Moreover, this results in a particularly good thermal conductivity between the particles of the electrophoretic layer as well.

A further step, which can also be carried out after the singulation of the semiconductor wafer, can involve bonding the at least one semiconductor chip, for example, through the metal oxide layer onto the contact region.

As an alternative thereto and preferably, the matrix material, in particular the metal oxide layer, can be removed again at least partly, preferably in the region of the contact region. This step can be carried out before or after the singulation of the semiconductor wafer. In this case, the removal is carried out, for example, in an anisotropic structuring method, for example, in a dry etching method.

This step can also involve removing the matrix material in the region of the separating trenches of the carrier substrate, in order to facilitate later singulation of the semiconductor wafer.

After the removal of the metal oxide layer in the contact region, the contact region can be connected to a bonding wire for electrically contacting the semiconductor chip. By way of example, the bonding wire is soldered onto the contact region.

By means of the removing process, the matrix material that was formed on the surface of the electrophoretic layer is also at least partly removed. After the removing process, the surface of the electrophoretic layer facing away from the semiconductor chip is preferably free of matrix material. In this way, the matrix material remains only within the electrophoretic layer, i.e., between and below the particles of the electrophoretic layer and at the side surfaces of the electrophoretic layer, in order to ensure stabilization of the layer by means of an interaction of the particles with the matrix material. The surface of the electrophoretic layer facing away from the semiconductor chip can have traces of the removal process for removing the matrix material, that is to say, for example, traces of the dry etching method. By way of example, the surface can be roughened or furrowed.

In accordance with at least one embodiment, the matrix material can be applied by spin casting or spin coating on at least the partial region of the surface of the semiconductor wafer facing away from the carrier substrate.

Preferably, the matrix material comprises a spin-on glass or a spin-on silicone. The spin-on glass is applied as sol-gel material in the dissolved state, for example, to the surface of the semiconductor wafer facing away from the carrier substrate. This brings about efficient covering of the electrophoretic layer with the matrix material.

In a further step, the matrix material is then removed at least in the region of the at least one contact region. Later bonding of the semiconductor chip is thus facilitated and an effective fixing of the electrophoretic layer is ensured. The matrix material deposited on the rest of the surface of the semiconductor chip is not removed in this step, and so that electrophoretic layer applied on the surface is also still enveloped by the matrix material.

The matrix material can be removed by wet-chemical etching, for example. In this step, it is also possible to remove the matrix material in the region of the separating trenches of the carrier substrate, in order to facilitate later singulation of the semiconductor wafer. Preferably, matrix material remains only on the electrophoretic layer after this step, such that the electrophoretic layer is completely enveloped by the matrix material.

In a further step, the residual matrix material is cured or dried. This can be carried out, for example, by exposure of the matrix material. Drying removes volatile constituents from the spin-on glass or spin-on silicone. By way of example, the sol-gel material undergoes transition to a gel-like state during incipient drying.

Furthermore, the contact region freed of the matrix material is connected to a bonding wire for electrically contacting the semiconductor chip.

In accordance with at least one embodiment, a further step involves singulating the semiconductor wafer. Singulating is carried out, for example, by means of laser separation of the carrier substrate at the position of the separating trenches. However, sawing processes, breaking or scribing can also be used for singulating the semiconductor wafer. Singulating the semiconductor wafer gives rise to a multiplicity of radiation-emitting semiconductor components.

In accordance with a further aspect, a radiation-emitting semiconductor component, component for short, is specified. The component emits electromagnetic radiation, preferably light.

The component is preferably produced with the aid of the method described above. Accordingly, all features disclosed for the method are also disclosed for the component, and vice versa.

The component comprises at least one carrier substrate, preferably the carrier substrate described above.

The component furthermore comprises at least one semiconductor chip, preferably the semiconductor chip described above. The semiconductor chip has an active zone for generating electromagnetic radiation, preferably colored light.

The semiconductor chip is arranged on the carrier substrate. The semiconductor chip is fixed on the carrier substrate. The semiconductor chip can be fixed, for example, by soldering, silver sintering, in a direct bonding method or by means of contacting by contact elevations (bumps). The carrier substrate serves for mechanically stabilizing the semiconductor chip.

At least one contact region, for example, a bonding pad, is formed at a surface of the semiconductor chip facing away from the carrier substrate.

The component furthermore comprises an electrophoretically deposited material, preferably the material described above. The material can, for example, comprise particles of a luminophore, for example, phosphor particles, or particles of a reflective material or be formed from particles of a luminophore or particles of a reflective material.

The material preferably serves to at least partly convert the primary radiation emitted by the semiconductor chip into an electromagnetic secondary radiation. The material is accordingly preferably a wavelength conversion material.

The material is arranged on the surface of the semiconductor chip facing away from the carrier substrate. However, the contact location is free of the material. The material is deposited in the form of a layer, in particular an electrophoretic layer, on the surface of the semiconductor chip facing away from the carrier substrate with the exception of the contact location. The material or the electrophoretic layer covers the surface of the semiconductor chip facing away from the carrier substrate with the exception of the contact location.

The component furthermore comprises a matrix material. The matrix material preferably comprises a metal oxide. The matrix material adjoins the electrophoretically deposited material in places. The electrophoretically deposited material is preferably free of the matrix material at the surface facing away from the semiconductor chip. Rather, matrix material that was deposited in an ALD process, for example, is formed only within the electrophoretically deposited material, that is to say between and below the individual particles of the electrophoretic layer.

The surface of the electrophoretically deposited material facing away from the semiconductor chip has traces of a removal process. By way of example, the surface is roughened or furrowed. During the removal process, matrix material that was originally present on the surface of the electrophoretic layer facing away from the carrier substrate was preferably removed from the surface, for example, by means of a dry etching method.

A particularly efficient fixing or stabilization of the electrophoretically deposited layer is ensured by the matrix material formed between the particles of the electrophoretically deposited layer or of the electrophoretically deposited material. In particular, the fixing is effected by the interaction of the individual particles within the electrophoretic layer with the matrix material. The component is thus particularly stable.

By virtue of the matrix material formed between the particles of the electrophoretic layer, the electrophoretic layer has a particularly high thermal conductivity and is thus very efficient as a consequence.

Furthermore, the traces of the removal process have an advantageous effect on the emission characteristic of the component. In particular, a scattering and/or reflection of the radiation emitted by the semiconductor chip can be obtained by virtue of the roughened surface of the electrophoretically deposited material or of the electrophoretic layer. The scattering and/or reflection take(s) place in particular diffusely, i.e., in a plurality of directions, on account of the surface constitution. Further component parts, for example, a lens, are therefore not necessary in order to bring about a scattering of the radiation emitted by the semiconductor chip. Accordingly, the component is constructed particularly cost-effectively and simply.

BRIEF DESCRIPTION OF THE DRAWINGS

The method and the component are explained in greater detail below on the basis of exemplary embodiments and the associated figures.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

Figure 1:
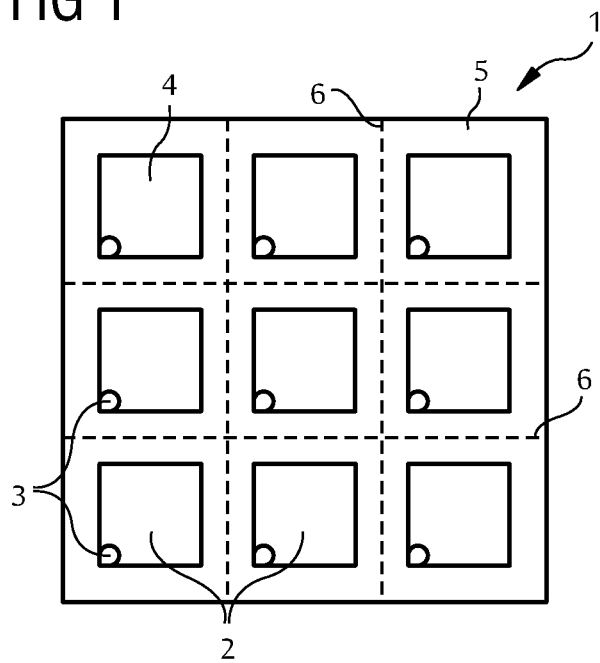
FIG. 1 shows a plan view of a semiconductor wafer before the process of applying the electrophoretic layer.

FIG. 1 shows a semiconductor wafer 1. The semiconductor wafer 1 has a carrier substrate 5 and nine semiconductor chips 2. The semiconductor wafer 1, wafer 1 for short, can also have more than nine semiconductor chips 2, however.

In one alternative exemplary embodiment, the wafer 1 can also have fewer than nine semiconductor chips 2, for example, six semiconductor chips or one semiconductor chip 2.

The semiconductor chips 2 are suitable for emitting electromagnetic radiation, preferably light. The semiconductor chips 2 are arranged and fixed, e.g., soldered, on the carrier substrate 5. The carrier substrate 5 serves for mechanically stabilizing the semiconductor chips 2.

The carrier substrate 5 has separating trenches 6. The separating trenches constitute depressions or furrows of the surface of the carrier substrate 5 which faces the semiconductor chips 2. The semiconductor chips 2 are separated from one another by the separating trenches 6. The separating trenches 6 serve for facilitating the singulation of the wafer 1 into individual radiation-emitting components (see FIG. 4, for example).

The semiconductor chips 2 have a surface 4 facing away from the carrier substrate 5. On the surface 4, the respective semiconductor chip 2 has a contact location 3 or bonding pad for electrically contacting the semiconductor chip 2.

Figure 2:
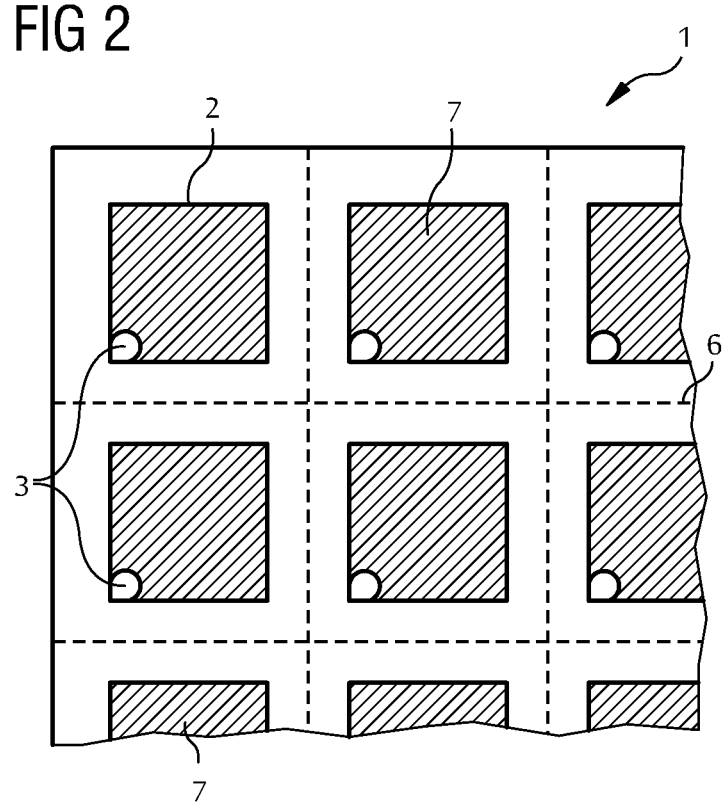
FIG. 2 shows an excerpt from the semiconductor wafer from FIG. 1 after the process of applying the electrophoretic layer.

In order to produce individual radiation-emitting components, after the process of fixing the semiconductor chips 2 on the carrier substrate 5, firstly a material 7 in the form of an electrophoretic layer is deposited on the surface 4 of the respective semiconductor chip 2 facing away from the carrier substrate 5 (see FIG. 2).

The material 7 can comprise particles of a luminophore, e.g., phosphor particles, or particles of a reflective material. In the present case, the material 7 serves to at least partly convert the primary radiation emitted by the respective semiconductor chip 2 into an electromagnetic secondary radiation. The material 7 is a wavelength conversion material in the present exemplary embodiment.

The wavelength conversion material is applied by electrophoresis. By means of the electrophoresis, a layer composed of the wavelength conversion material, that is to say a wavelength conversion layer, is applied or electrophoretically deposited on a part of the surface 4 of the semiconductor chip 2 facing away from the carrier substrate 5. The respective contact location 3 of the semiconductor chip 2 remains in particular free of wavelength conversion material. This procedure is described thoroughly in the German patent application having the file reference 10 2012 105 691.9 already cited previously.

Figure 3:
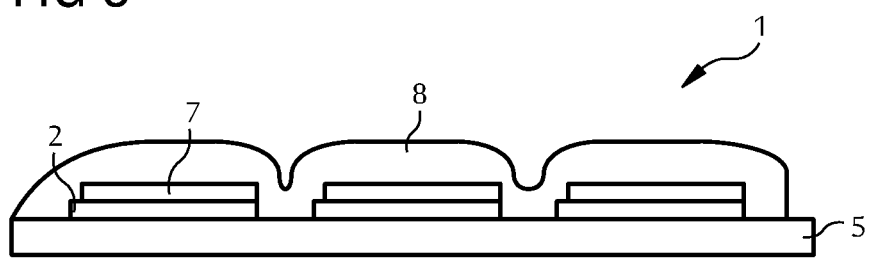
FIG. 3 shows a cross section of the semiconductor wafer from FIG. 2 after the process of applying the matrix material.

During the electrophoretic deposition of the wavelength conversion material, the region of the separating trenches 6 can also be at least partly omitted, for example, by means of a mask, such that only a thin or no wavelength conversion layer or electrophoretically deposited layer at all is applied in the region of the separating trenches 6 (see FIGS. 2 and 3, for example).

The wavelength conversion layer is free of a matrix material, e.g., glass or ceramic. In particular, in this exemplary embodiment, the wavelength conversion layer consists exclusively of the particles of the luminophore.

In a next step, a matrix material 8 is applied at least on a part of the surface of the wafer 1 which faces away from the carrier substrate 5 (see FIG. 3, for example), in order to fix or mechanically stabilize the wavelength conversion layer.

The matrix material 8 can be applied in various ways, which are explained in greater detail below:

In a first exemplary embodiment (see FIGS. 3 and 4), the matrix material 8 is applied by a PECVD method. With the aid of TEOS as starting material, in this method a metal oxide layer (e.g., $SiO_2$) is deposited on the surface of the wafer 1 facing away from the carrier substrate 5. In this method, the SiO$_2$ grows reactively at the surface of the wafer 1 and encapsulates the wavelength conversion layer, such that the latter is protected and fixed by the matrix material 8.

In accordance with the exemplary embodiment shown here, the layer composed of matrix material 8 covers the entire surface of the wafer 1 (see FIG. 3, for example). As an alternative thereto (not explicitly illustrated), however, the matrix material 8 can also be deposited only on the wavelength conversion layer, such that the wavelength conversion layer is completely enveloped by the matrix material. This can be achieved with the aid of a shadow mask which leaves free only the region of the wavelength conversion layer for the deposition.

The layer composed of matrix material 8 deposited by the PECVD method has a thickness of 50 nm to 500 nm, for example, 200 nm. Depending on the thickness of the layer, for example, for a thickness of more than 200 nm, in a further step the matrix material 8 is removed in the contact region 3 (not explicitly illustrated), in order to ensure later bonding of the respective semiconductor chip 2. The removal of the matrix material 8 can be carried out before or after the singulation of the semiconductor wafer 1, which is described in detail later.

The removal process is carried out, for example, by means of reactive sputtering or by means of a plasma process. In this case, it is also possible to remove the matrix material 8 in the region of the separating trenches 6, if the wafer 1 is singulated at a later point in time (not explicitly illustrated). After the removal process, the wavelength conversion layer is still completely enveloped by the matrix material 8.

By contrast, if the layer composed of matrix material 8 is very thin, if the thickness is 200 nm or less, for example, then it is possible to carry out the bonding of the semiconductor chip 2 through the layer composed of matrix material 8 onto the contact region 3, as will be described later (see FIG. 7B). In this case, it is not necessary for matrix material 8 to be removed.

Figure 5A:
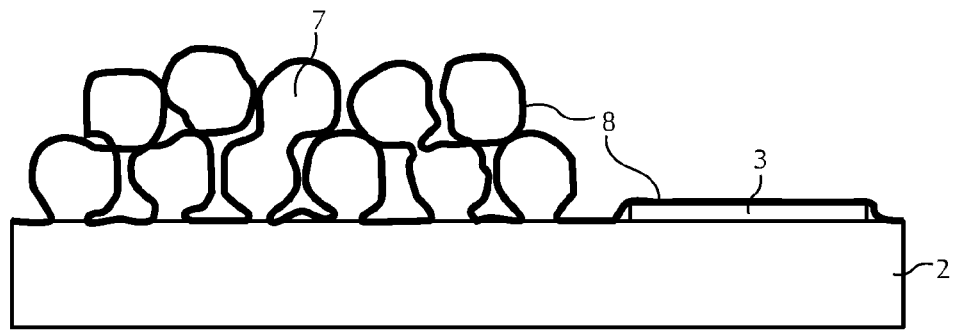
FIG. 5A shows a cross section of a part of the semiconductor wafer from FIG. 2 in accordance with a further exemplary embodiment.

In a second exemplary embodiment (see FIGS. 5A and 5B), the matrix material 8 is applied by means of an ALD method. With the aid of a gaseous starting material, in this method a thin metal oxide layer (e.g., SiO$_2$, Al$_2$O$_3$, TiO$_2$, ZrO$_2$, HfO$_2$) is deposited on the surface of the wafer 1 facing away from the carrier substrate 5.

The metal oxide completely envelops the wavelength conversion material and in particular the individual particles of the wavelength conversion layer. In this method, accordingly, the matrix material 8 is also introduced between and below the individual particles of the wavelength conversion layer. Furthermore, the surface of the wavelength conversion layer is encapsulated with the metal oxide layer (see FIG. 5A, for example).

The layer composed of matrix material 8 deposited by the ALD method has a thickness of 50 nm to 200 nm, for example, 150 nm. In particular, the layer composed of matrix material 8 deposited by the ALD method is substantially thinner than the layer composed of matrix material 8 deposited by the PECVD method. The layer composed of matrix material 8 is not planar on account of its only small thickness, but rather assumes the contours of the particles of the wavelength conversion layer arranged underneath (see FIG. 5A).

Figure 5B:
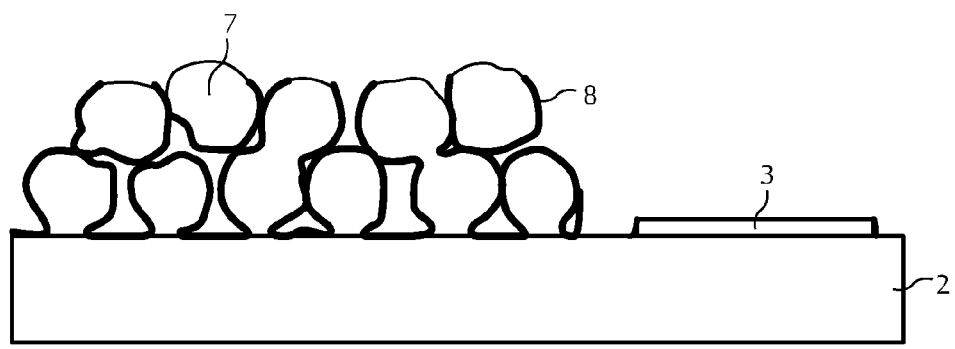
FIG. 5B shows the cross section from FIG. 5A after a further process step.

In order to enable later bonding of the respective semiconductor chip 2, in a further step it is necessary to remove the matrix material 8 in the contact region 3 (see FIG. 5B). The removal process can be carried out before or after the singulation of the wafer 1. In this case, the removal process is carried out, for example, in an anisotropic structuring method, for example, in a dry etching method. In this case, it is also possible to remove the matrix material 8 in the region of the separating trenches 6 (not explicitly illustrated).

Furthermore, the matrix material 8 which was deposited by the ALD method on the surface of the wavelength conversion layer facing away from the semiconductor chip 2 is also removed in this step. Therefore, matrix material 8 remains only between and below the particles of the wavelength conversion layer, i.e., within the wavelength conversion material, as is illustrated in FIG. 5B. Furthermore, matrix material 8 remains at the side surfaces of the wavelength conversion layer. In other words, the component available at the end of the process comprises a wavelength conversion layer whose surface facing away from the semiconductor chip 2 is free of matrix material 8.

The surface of the wavelength conversion layer facing away from the semiconductor chip has traces of the anisotropic structuring method, for example, the dry etching method. By way of example, the surface is roughened or furrowed (not explicitly illustrated).

In a third exemplary embodiment (see FIG. 6), the matrix material 8 can also be applied by spin casting or spin coating. The matrix material used in this case can comprise a spin-on glass or a spin-on silicone.

Figure 6:
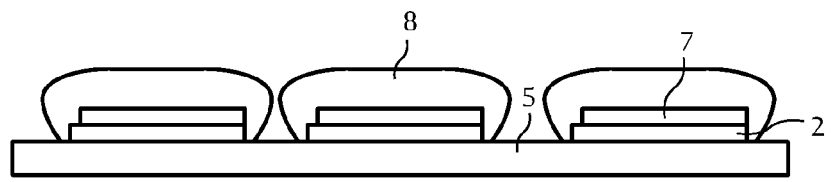
FIG. 6 shows a cross section of the semiconductor wafer from FIG. 2 after the process of applying the matrix material in accordance with a further exemplary embodiment.

It is once again possible for the entire surface facing away from the carrier substrate 5 to be covered by the matrix material 8 in this case (not explicitly illustrated). As an alternative thereto, for example, through the use of a mask, it is also possible for only the semiconductor chip 2 to be covered by the matrix material 8, as is indicated in FIG. 6. In particular, through the use of a mask, the region of the separating trenches 6 can be kept free of matrix material 8.

The matrix material 8 comprising spin-on glass or spin-on silicone is then removed again in the contact region 3 of the semiconductor chip 2 (not explicitly illustrated). The removal can be carried out by means of wet-chemical etching, for example. In this case, it is also possible to remove the matrix material 8 in the region of the separating trenches 6 of the carrier substrate 5, if no mask was used (not explicitly illustrated). After this step, the matrix material 8 preferably remained only on the surface 4 of the semiconductor chip 2 applied the carrier substrate 5 with the exception of the contact location 3. After the removal process, the wavelength conversion layer is still completely enveloped by the matrix material 8.

The matrix material 8 that remained on the surface 4 of the semiconductor chip 2 is then cured, for example, by exposure of the matrix material 8.

Figure 4:
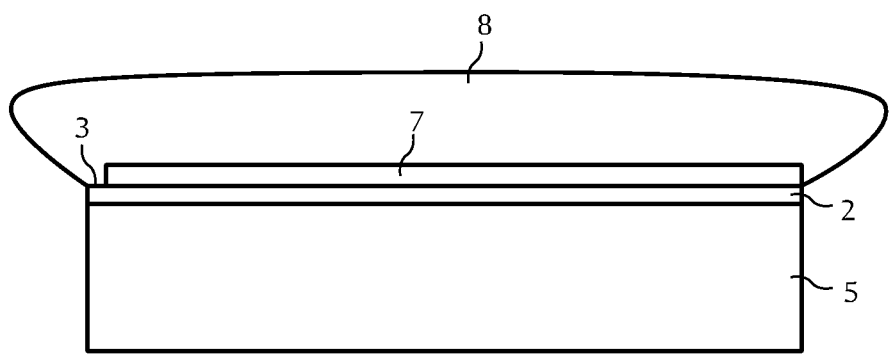
FIG. 4 shows a cross section of a radiation-emitting component.

After the process of applying the matrix material 8 in accordance with one of the three exemplary embodiments, the wafer 1 is singulated in this exemplary embodiment (see FIG. 4, for example). In particular, the carrier substrate 5, for example, with the aid of a laser, is separated at the location of the separating trenches 6. As a result, a multiplicity of components are obtained, wherein each component has a piece of the carrier substrate 5 and a semiconductor chip 2 with the above-described wavelength conversion layer and the matrix material 8.

A further step involves electrically contacting the component and in particular the respective semiconductor chip 2. In this case, a bonding wire 10 (see FIG. 7B) is connected to the contact location 3 of the semiconductor chip 2. The bonding wire 10 is soldered, for example, onto the contact location 3. In the case of a very thin layer composed of matrix material 8, for example, 200 nm or less, the contacting can be effected in this case through the matrix material 8, as is illustrated in FIG. 7B.

Figure 7A:
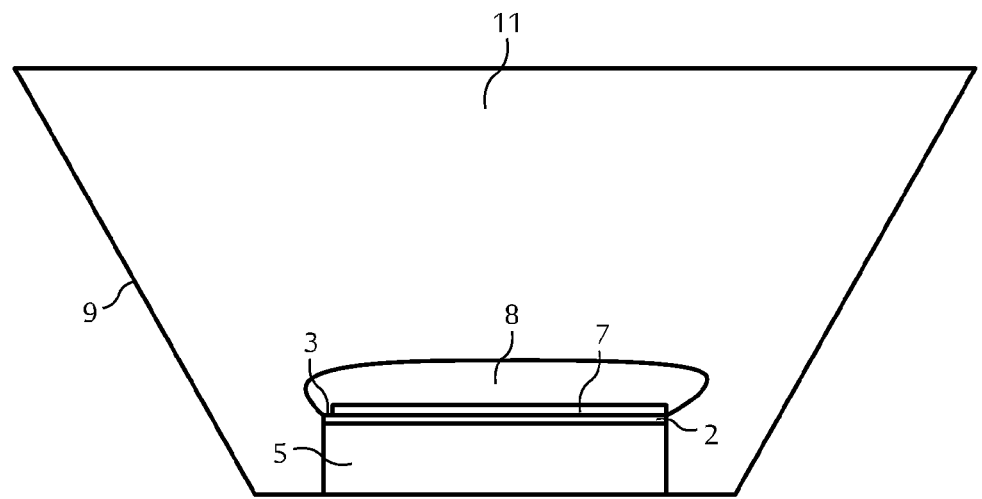
FIGS. 7A and 7B show one exemplary embodiment of a radiation-emitting component.

In a further step, the respective component is introduced into a housing 9 (see FIG. 7A) and in particular fixed, for example, soldered, on a bottom of the housing 9.

Figure 7B:
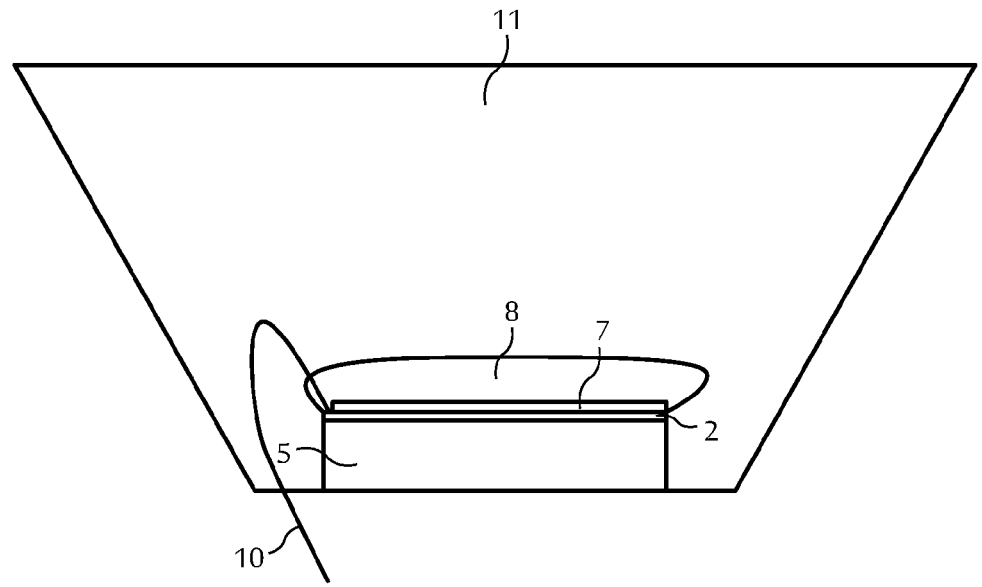

The housing 9 can furthermore be filled with a potting material 11, for example, silicone (see FIG. 7B). The potting material 11 serves for protecting the component.

By virtue of the covalent linkage of the particles of the wavelength conversion layer to the matrix material 8 deposited thereon, it is possible, particularly in the case of the first exemplary embodiment (PECVD method) and the third exemplary embodiment (spin casting or spin coating), to prevent wetting of the individual particles of the wavelength conversion layer with the potting material 11. An optimum heat exchange between the particles of the wavelength conversion layer thus remains ensured.

Alternatively or additionally, in a further step (not explicitly illustrated), a beam shaping element, e.g., a lens, can be disposed downstream of the component.

The invention is not restricted to the exemplary embodiments by the description on the basis of said exemplary embodiments. However, the invention encompasses any novel feature and also any combination of features, which in particular includes any combination of features in the patent claims, even if this feature or this combination itself is not explicitly specified in the patent claims or exemplary embodiments.

The invention claimed is:

1. A method for making a semiconductor chip, the method comprising:
   providing a semiconductor wafer, wherein the semiconductor wafer has a carrier substrate and a semiconductor chip, wherein the semiconductor chip has an active zone for generating electromagnetic radiation, and wherein a contact region is disposed at a surface of the semiconductor chip facing away from the carrier substrate;
   electrophoretically depositing a material on a surface of the semiconductor chip facing away from the carrier substrate in order to form an electrophoretically deposited layer, wherein none of the material is deposited on the contact region; and
   applying an inorganic matrix material to a region of a surface of the semiconductor wafer facing away from the carrier substrate in order to fix the material on the semiconductor chip,
   wherein the matrix material is removed on a surface of the electrophoretically deposited material facing away from the semiconductor chip such that the surface is free of the matrix material.

2. The method according to claim 1, wherein applying the matrix material comprises initiating a chemical reaction in at least the region of the surface of the semiconductor wafer facing away from the carrier substrate.

3. The method according to claim 2, wherein, during the chemical reaction, a metal oxide layer is formed as matrix material at least on the region of the surface of the semiconductor wafer facing away from the carrier substrate.

4. The method according to claim 3, wherein the metal oxide layer is applied in a plasma-enhanced vapor deposition process, and wherein a tetraethyl orthosilicate is made available as starting material in order to deposit the metal oxide layer on at least the region of the surface of the semiconductor wafer facing away from the carrier substrate.

5. The method according to claim 3, further comprising:
   bonding the semiconductor chip through the metal oxide layer onto the contact region; and
   singulating the semiconductor wafer.

6. The method according to claim 3, further comprising:
   removing the matrix material at least in a region of the contact region;
   bonding the semiconductor chip; and
   singulating the semiconductor wafer.

7. The method according to claim 6, wherein removing the matrix material in the region of the contact region is effected by reactive sputtering, by a plasma process, or by an anisotropic structuring method.

8. The method according to claim 1, wherein the matrix material is deposited in an atomic layer deposition process on at least the region of the surface of the semiconductor wafer facing away from the carrier substrate.

9. The method according to claim 1, wherein the matrix material is applied by spin casting or spin coating on at least the region of the surface of the semiconductor wafer facing away from the carrier substrate.

10. The method according to claim 9, further comprising:
    removing the matrix material at least in the region of the contact region;
    curing the matrix material that remains on the surface of the semiconductor wafer facing away from the carrier substrate; and
    singulating the semiconductor wafer.

11. The method according to claim 10, wherein removing the matrix material in the region of the contact region is effected by wet-chemical etching.

12. The method according to claim 9, wherein the matrix material comprises a spin-on glass or a spin-on silicone.

13. The method according to claim 1, wherein the electrophoretic layer comprises particles of a luminophore or particles of a reflective material.

14. The method according to claim 1, wherein the contact region is kept potential-free during the electrophoretic deposition.

15. A radiation-emitting semiconductor component, comprising:
    a carrier substrate,
    a semiconductor chip, wherein the semiconductor chip has an active zone for generating electromagnetic radiation, wherein the semiconductor chip is arranged on the carrier substrate, and wherein a contact region is disposed at a surface of the semiconductor chip facing away from the carrier substrate;
    an electrophoretically deposited material arranged on the surface of the semiconductor chip facing away from the carrier substrate, the contact region being free of the electrophoretically deposited material; and
    a matrix material adjoining the electrophoretically deposited material in places, wherein a surface of the electrophoretically deposited material facing away from the semiconductor chip is free of matrix material, and wherein the surface of the electrophoretically deposited material facing away from the semiconductor chip has traces of a removal process for removing the matrix material.

16. A method for making a semiconductor chip, the method comprising:
    providing a semiconductor wafer, wherein the semiconductor wafer has a carrier substrate and a semiconductor chip, wherein the semiconductor chip has an active zone for generating electromagnetic radiation, and wherein a contact region is disposed at a surface of the semiconductor chip facing away from the carrier substrate;

electrophoretically depositing a material on the surface of the semiconductor chip facing away from the carrier substrate in order to form an electrophoretically deposited layer, wherein none of the material is deposited on the contact region; and applying an inorganic matrix material to a region of a surface of the semiconductor wafer facing away from the carrier substrate in order to fix the material on the semiconductor chip, wherein the matrix material comprises a metal oxide layer, wherein the metal oxide layer is applied in a plasma-enhanced vapor deposition process, wherein a tetraethyl orthosilicate is made available as a starting material in order to deposit the metal oxide layer on at least the region of the surface of the semiconductor wafer facing away from the carrier substrate, and wherein the matrix material completely surrounds the material of the electrophoretic layer.

17. The method according to claim 16, wherein applying the matrix material is effected by initiating a chemical reaction in at least the region of the surface of the semiconductor wafer facing away from the carrier substrate.

18. The method according to claim 17, wherein the metal oxide layer is applied during the chemical reaction.

* * * * *